(12) United States Patent
Doudoumopoulos et al.

(10) Patent No.: US 7,799,666 B1
(45) Date of Patent: Sep. 21, 2010

(54) METHOD OF SPATIALLY SELECTIVE LASER-ASSISTED DOPING OF A SEMICONDUCTOR

(75) Inventors: Nicholas A. Doudoumopoulos, Garrett Park, MD (US); C. Paul Christensen, Tracys Landing, MD (US); Paul Wickboldt, Walnut Creek, CA (US)

(73) Assignee: Potomac Photonics, Inc., Lanham, MD (US)

( * ) Notice: Subject to any disclaimer, the term of this patent is extended or adjusted under 35 U.S.C. 154(b) by 0 days.

(21) Appl. No.: 12/509,621

(22) Filed: Jul. 27, 2009

(51) Int. Cl.
*H01L 21/42* (2006.01)
*H01L 21/26* (2006.01)
*H01L 21/38* (2006.01)

(52) U.S. Cl. .................. 438/535; 438/487; 438/513; 438/558; 438/795; 257/E21.347; 257/E21.349

(58) Field of Classification Search .......... 257/E21.347, 257/E21.349
See application file for complete search history.

(56) References Cited

U.S. PATENT DOCUMENTS

| | | | |
|---|---|---|---|
| 4,147,563 A | | 4/1979 | Narayan et al. |
| 5,840,592 A | * | 11/1998 | Russell et al. ............... 438/795 |
| 6,323,069 B1 | | 11/2001 | Yamazaki et al. |
| 6,395,624 B1 | | 5/2002 | Bruce et al. |
| 6,818,535 B2 | | 11/2004 | Lu et al. |
| 6,949,422 B2 | * | 9/2005 | Kim ........................... 438/166 |
| RE39,988 E | | 1/2008 | Wickboldt et al. |
| 2002/0106820 A1 | * | 8/2002 | Nikawa ....................... 438/14 |

OTHER PUBLICATIONS

Furuta et al., Bottom-Gate Poly-Si Thin Film Transistors Using XeCl Excimer Laser Annealing and Ion Doping Techniques, IEEE Transaction on Electron Devices. vol. 40, No. 11, Nov. 1993, pp. 1964-1969.*

* cited by examiner

*Primary Examiner*—Charles D Garber
*Assistant Examiner*—Mohsen Ahmadi
(74) *Attorney, Agent, or Firm*—Rosenberg Klein & Lee

(57) ABSTRACT

A method utilizing spatially selective laser doping for irradiating predetermined portions of a substrate of a semiconductor material is disclosed. Dopants are deposited onto the surface of a substrate. A pulsed, visible beam is directed to and preferentially absorbed by the substrate only in those regions requiring doping. Spatial modes of the incoherent beam are overlapped and averaged, providing uniform irradiation requiring fewer laser shots. The beam is then focused to the predetermined locations of the substrate for implantation or activation of the dopants. The method provides for scanning and focusing of the beam across the substrate surface, and irradiation of multiple locations using a plurality of beams. The spatial selectivity, combined with visible laser wavelengths, provides greater efficiency in doping only desired substrate regions, while reducing the amount of irradiation required. Savings in cost and manufacturing throughput can be achieved, particularly with respect to doping polycrystalline silicon.

20 Claims, 4 Drawing Sheets

METHOD OF SPATIALLY SELECTIVE LASER-ASSISTED DOPING OF A SEMICONDUCTOR

FIELD OF THE INVENTION

The present invention relates to the field of fabricating and manufacturing semiconductors. In particular the invention relates to the field of doping a substrate to form a semiconductor. Still further, this invention relates to the field of doping a semiconductor material in a predetermined pattern. Further, this invention relates to the field of spatially selective, laser assisted doping of a semiconductor substrate.

BACKGROUND OF THE INVENTION

This invention relates to the doping of a semiconductor material to provide a semiconductor device having a predetermined pattern of doped regions.

Additionally, this invention directs itself to a method of doping a semiconductor material where the doped regions are spatially selective. Additionally, this invention is directed to the doping of a semiconductor material or substrate with a pulsed visible laser beam which may be controlled to focus the laser beam on at least one selectively predetermined region of the substrate surface.

Still further, this invention is directed to a method of doping a semiconductor material whereby a spatially uniform beam is focused on a selectively predetermined region of the substrate surface for implanting dopants into the substrate.

This invention directs itself to a method of doping a semiconductor substrate without the necessity of having to mask a plurality of dopant regions on the surface of the substrate.

This invention relates to a method of doping a semiconductor substrate using a pulsed visible laser beam which can be controlled for focusing the laser beam on at least one of a plurality of doping regions on the substrate surface.

This invention is directed to a method of doping a semiconductor substrate while only irradiating specific regions of the semiconductor substrate wherein doping is required.

PRIOR ART

Traditional semiconductor manufacturing processes typically include ion implantation to introduce impurities/dopants into a substrate. Substrate temperatures sometimes in excess of 800° C. are required to activate the impurities. However, these high temperatures are generally not suitable for flexible electronic structures that contain a polymer substrate, or display devices utilizing low temperature processing of silicon (LTPS).

Laser assisted doping is a technique for activating the implanted ions or driving surface dopants into the substrate. In this process, a pulsed laser alternately melts and cools areas of a silicon substrate or other substrate material. Impurities delivered from a surrounding gas, for instance, can then diffuse into the molten regions. As the melted areas of the substrate cool (when the pulse of laser energy is not present), the impurities remain in the substrate. The resulting product may be a p-type or n-type semiconductor. This technique alternately melts and cools the substrate material, which correspondingly crystallizes the structure after cooling.

Current methods of manufacturing semiconductors include well known photo-lithographic processes such as mask, mask projection, or blanket scanning, used in conjunction with pulsed lasers. FIG. 1 illustrates a conventional method of doping a semiconductor. Impurities or dopants 10 are deposited over the entire surface of a substrate 12. A photo-lithographic mask 14 is then used to expose portions of the substrate to incoherent UV laser light 16. The laser beam irradiates a portion of the substrate as defined by the pattern on the mask. The irradiated portions typically have a greater area than a particular element or feature requiring the doping, such as a TFT (thin film transistor).

This technique however suffers from various shortcomings: the emitted laser energy is an incoherent UV beam, and the pulsed light impinges on and illuminates a greater area of the substrate than is necessary. This is due to the fact that the TFT is confined to a small portion of the substrate, but the dopant covers the entire surface and the exposed portion is illuminated subject to the mask pattern. The end result is a highly inefficient process in which laser energy that is not needed is blocked by the mask. Additionally many laser shots are necessary due to the incoherent and unstable nature of the beam and its delivery to the surface of the material.

SUMMARY OF THE INVENTION

It is an objective of the invention to reduce the amount of laser energy delivered to the substrate in a doping process by selectively illuminating only those areas requiring impurities, without the use of a mask.

It is a further object to create various semiconductor materials in a lower temperature environment than is traditionally available.

It is a further object of the subject concept to dope a substrate through the use of a pulsed, visible laser beam.

An additional objective is to control a pulsed, visible laser beam to irradiate predetermined selective regions of a surface of the substrate.

It is yet another object to homogenize a multiplicity of spatial modes of the laser beam to produce a spatially uniform laser beam.

Another object of the subject concept is to focus the resulting homogenized beam onto only selectively predetermined regions of the substrate in order to implant the dopants in the substrate material.

A source of dopants is first deposited onto the entire surface of a substrate. A plurality of regions is then defined for subsequent irradiation. A focused pulsed, visible laser beam selectively irradiates only those regions on the substrate requiring doping, where TFTs (thin film transistors) are needed for example. The output of the laser is controlled in order to focus the beam onto these particularly chosen regions. Homogenization optics transforms the beam, which is highly incoherent, into a substantially spatially uniform beam by overlapping and averaging the spatial modes of the laser. This uniformity allows a greater concentration of the laser energy into useful spatial modes, reducing the number of laser shots needed to complete the doping by a factor of about 10 to 20 at each spatially selected region. The resulting beam is then focused onto the substrate by spatially selecting those areas requiring the dopant to be implanted in the substrate material. The choice of visible wavelengths dictates that the energy per photon will be smaller than typical UV wavelengths, enabling preferential absorption by materials such as poly-crystalline silicon and thereby reducing heat build-up on the surface. Areas of the substrate not requiring doping are not irradiated, thus saving laser energy and further avoiding excess heat deposition.

Additional aspects of the method allow for multiple laser beams to irradiate a plurality of predetermined regions of the substrate. This can be achieved by utilizing arrangements of light pipes or beam scanners such as 2-axis galvanometers, and even 3-axis stages. The latter element permits selective positioning of different doping regions of the substrate to be at the focus of the beam(s). The combination of visible wavelengths and spatially selective doping enables an overall savings in time and cost of manufacturing, while providing for greater efficiency and throughput. In the subject method a fraction of the substrate is doped and no mask is required, which relates to an economically advantageous method with less energy being expended than that found in prior art methods.

DETAILED DESCRIPTION OF THE PREFERRED EMBODIMENTS

Figure 1:
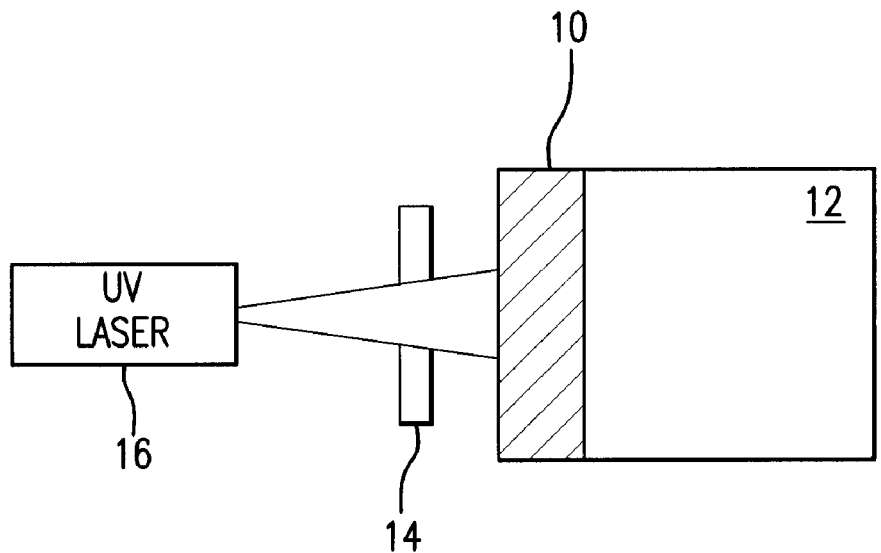
FIG. 1 is a schematic diagram of a conventional semiconductor substrate with surface-deposited dopants, mask, and laser irradiation.
Figure 2:
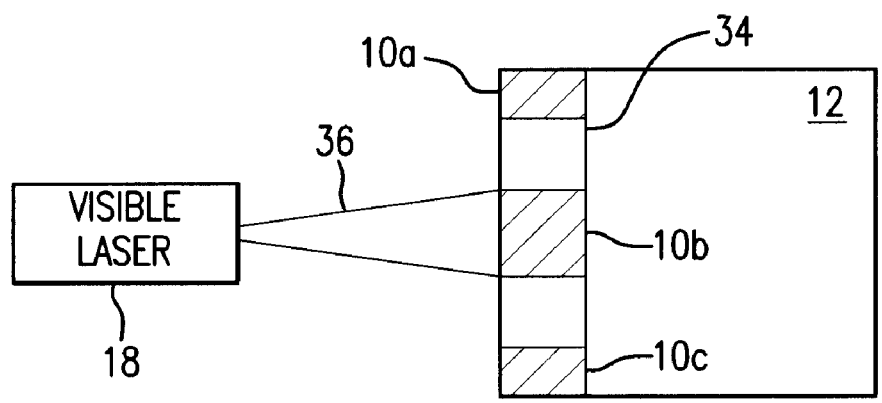
FIG. 2 is a schematic diagram of a semiconductor substrate with surface-deposited dopants and spatially selected laser irradiation, in accordance with the present invention concept.

Referring now to FIG. 2, there is shown laser 18 which in general may be a visible laser such as an argon-ion, copper vapor, or frequency-converted Nd:YAG diode laser, which is displaced from substrate 12. However, as will be explained presently, laser emission between 500 and 600 nm is desired. A source of impurities or dopants 10 is initially coated on substrate surface 34 to provide a substantially uniform coating of dopants 10 over substrate surface 34.

Pulsed visible laser beam 36 is emitted from visible laser 18 to impinge on the coated dopant 10 formed on substrate surface 34.

Pulsed visible laser beam 36 is shown to irradiate the dopant 10 in predetermined regions which are spatially selective on substrate surface 34. The dopant regions being irradiated by visible laser 18 are shown in FIG. 2 as elements 10a, 10b and 10c. These dopant regions shown in FIG. 2 are for illustrative purposes only and in practice, such dopant regions 10a, 10b and 10c would be formed in some selective pattern on substrate surface 34.

Substrate 12 may be formed of a variety of materials, however, in common practice such is generally a silicon substrate and the substrate 12 may be in some cases extremely thin to provide flexible electronic structures which would be used when polymer compositions are used as a material for the substrate 12.

Dopant 10 may be deposited on substrate surface 30 through a variety of techniques: Plasma Enhanced Chemical Vapor Deposition (PECVD), spinning the dopant onto the substrate surface 34 to form some type of liquid organic matrix, or through the formation of a spin-on glass.

The subject system and method uses a technique which permits spatially selective laser assisted doping to irradiate only those areas of substrate surface 34 where doping is required in some predetermined pattern. Thus, through use of the present method, only those areas of substrate 12 and substrate surface 34 are irradiated which will include some particular semiconductor element.

The subject method in particular uses a visible laser 18 which produces a pulsed laser beam 36 in the visible portion of the spectrum and preferably within the wavelengths between 500-600 nm. This range of visible light is preferentially absorbed by silicon substrates, which is in contrast to UV lasers used in conventional doping methods, having an upper limit of about 400 nm. The absorption coefficient of silicon is $\sim 10^4 \text{-} 10^5$ cm$^{-1}$ for $\lambda \approx 550$ nm. The preferential absorption of the visible pulsed laser beam reduces the surface heat buildup exhibited by materials such as silicon dioxide or polymers which are irradiated by conventional UV light.

In general, the visible pulsed laser beams 36 used (pulsed copper vapor lasers for instance) are highly incoherent and have a large beam quality or beam propagation factor $M^2$, which is essentially >15. The beam quality factor is well known in the art. Its exact mathematical description depends on how the laser beam width is defined. The width of an arbitrary laser beam can be quantified according to the "D86" diameter, knife edge percentages of integrated intensities, or 1/e and 1/e$^2$ intensity points, among other methods. Regardless of the chosen definition, $M^2$ gives a measure of the "quality" of an arbitrary beam, relative to a lowest order, single mode Gaussian or "ideal" beam. Equivalently, the value of $M^2$ indicates the number of "times diffraction limited" factor for the actual beam in the transverse direction of the beam spot. Additional considerations such as the chosen laser source and energy absorption characteristics of the substrate are manifested by selecting laser pulse repetition rates not exceeding 50 Khz, and maintaining individual pulse widths<approximately 200 ns.

Figure 3:
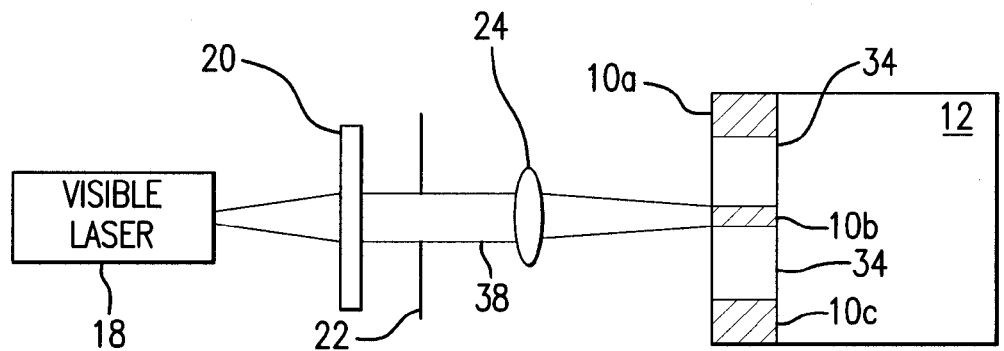
FIG. 3 is a schematic diagram according to the invention showing homogenizing optics, aperture, and focusing of the laser beam onto spatially selected regions of the substrate.

Referring now to FIG. 3 there is shown a method utilizing homogenizing optics 20 in combination with focusing optics 24 to produce a substantially uniform beam applied to dopant selective regions 10a, 10b and 10c. As clearly shown in FIG. 3, visible laser 18 is displaced from substrate 12 and surface 34 wherein focusing optics 24 and homogenizing optics 20 are interspersed between laser 18 and substrate 12. Homogenizing optics 20 are particularly used to overlap and average the spatial modes of laser beam 36. Such homogenizing optics may be a glass rod 20 or other suitable optical component well known in the art and commercially available which may be used for homogenization. A more spatially uniform beam 38 passes from glass rod or other homogenizing optics 20 and provides for an increased spatially uniform beam 38 wherein the beam 38 has a substantially smaller beam quality factor than beam 36. This allows for concentration of more of the laser energy into lower order spatial modes. The spatial selectivity, beam homogenization and energy-stable delivery permit fewer laser shots necessary to drive dopant 10 into substrate 12 in the allotted regions 10a, 10b and 10c. Thus, the total number of pulses required to complete implantation may be reduced by almost an order of magnitude using the present technique.

As further shown in FIG. 3, aperture 22 may be formed in the path of beam 38 to transform the beam into a particular contour such as a rectilinear shaping. The choice of beam shape depends in part on the particular array or plurality of predetermined regions that are to be irradiated. The rectilinear shape is particularly useful for overlapping two or more regions at the same time.

Focusing optics 24 may be inserted between homogenizing optics 20 and substrate 12 (subsequent to passage through the aperture 22) to focus the laser beam onto the particular dopant areas 10a, 10b and/or 10c formed on surface 34 of substrate 12. The focused laser energy then drives the dopants 10 into the substrate for activation or formation of a desired semiconductor element.

Thus, the method as shown in FIG. 3 includes depositing a source of dopants 10 onto surface 34 of substrate 12 for defining a multiplicity of selective doping regions 10a, 10b and 10c. Visible laser 18 establishes a laser source to emit a laser beam 36. The laser beam of visible laser 18 is ultimately focused in selective areas of substrate surface 34. A multiplicity of spatial modes of the laser beam is homogenized to produce a substantially spatially uniform laser beam 38 through the use of homogenizing optics 20 and the laser beam is focused subsequent to spatial uniformity being achieved, onto either dopant regions 10a, 10b or 10c defining the selectively predetermined regions for implanting the dopants into the surface of the substrate 12.

Figure 4:
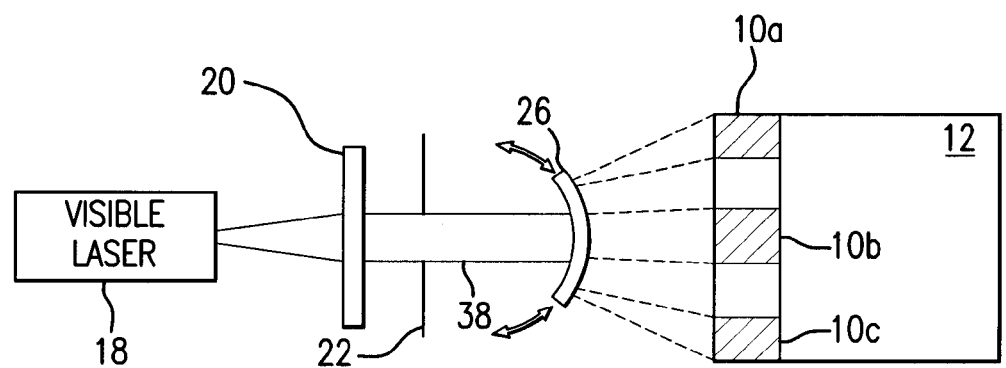
FIG. 4 is a schematic diagram of an embodiment of the present invention using a 2-axis galvanometer to scan across the substrate, creating the effect of multiple laser beams irradiating multiple regions of the substrate.

An aspect of controlling and positioning the beam with respect to the substrate surface is illustrated FIG. 4. A fast scanning, 2-axis galvanometer 26 irradiates the plurality of predetermined doping regions 10a, 10b, or 10c of the substrate 12. The 2-axis galvanometer allows rapid scanning of the beam in two dimensions across the substrate surface. The rapid scanning capability in essence provides for multiple "beamlets" to irradiate the predetermined doping regions. Generally, a galvanometer consists of two motor-controlled rotating mirrors, each reflecting the laser beam in a different dimension (x/y). The galvanometer 26 is disposed between the homogenization optics 20 and the substrate surface 34, scanning the homogenized beam 38. Additionally, the 2-axis galvanometer 26 may also include a combination of optics for focusing the homogenized laser beam 38 during scans across the substrate surface 34.

The aperture 22 provides a rectilinear shape or contour to laser beam 36. The 2-axis galvanometer then rapidly scans the rectilinear beam across the surface 34. In this embodiment the area of the beam that is scanned is slightly larger than the area of the predetermined dopant region.

In some instances the galvanometer may also position the focused beam longitudinally with respect to the substrate, along the laser beam propagation axis. To ensure proper absorption and implantation of dopants into the substrate, the surface should be planar: flat to within about +/−30% of the Rayleigh range of the focused laser beam 38. The Rayleigh range, given by $\pi \cdot w_0^2 / \lambda$, where $w_0$ is the beam's spot size at the laser beam waist, and is the beam's wavelength, is a measure of the length of the waist region along the longitudinal direction or beam propagation direction.

Figure 5:
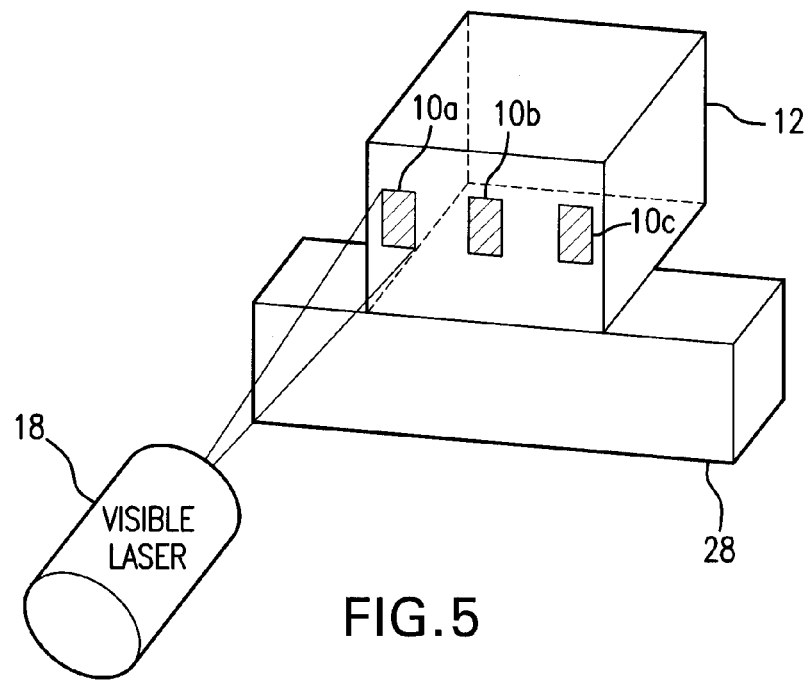
FIG. 5 is a schematic diagram according to an embodiment of the present invention, illustrating relative movement between the substrate and the laser in order to move or spatially select another region for irradiation.

Control of the homogenized and focused beam may also be provided by a 3-axis stage: transversely across the substrate surface, and longitudinally along an axis perpendicular to the surface. FIG. 5 schematically shows a 3-axis stage 28 providing and controlling relative movement between the laser 18 and the substrate 12. 3-axis stages are well known in the art, each stage of the integral unit controlling a separate dimension of movement (up/down, forward/backward, left/right, etc.). The 3-axis stage 28 is disposed between the substrate 12 and the combination of laser 18, homogenization optics 20, and focusing optics 24. The 3-axis stage permits the beam 38 to be scanned across desired doping regions 10a, 10b, or 10c on the substrate surface 34, and can also move the focus location along the beam's axis, further into the substrate 12 if desired. Both 2-axis galvanometers and 3-axis stages allow either the position of the beam focus to be moved with respect to a stationary substrate or vice versa, and in both instances, selectively predefined regions are irradiated.

Figure 6:
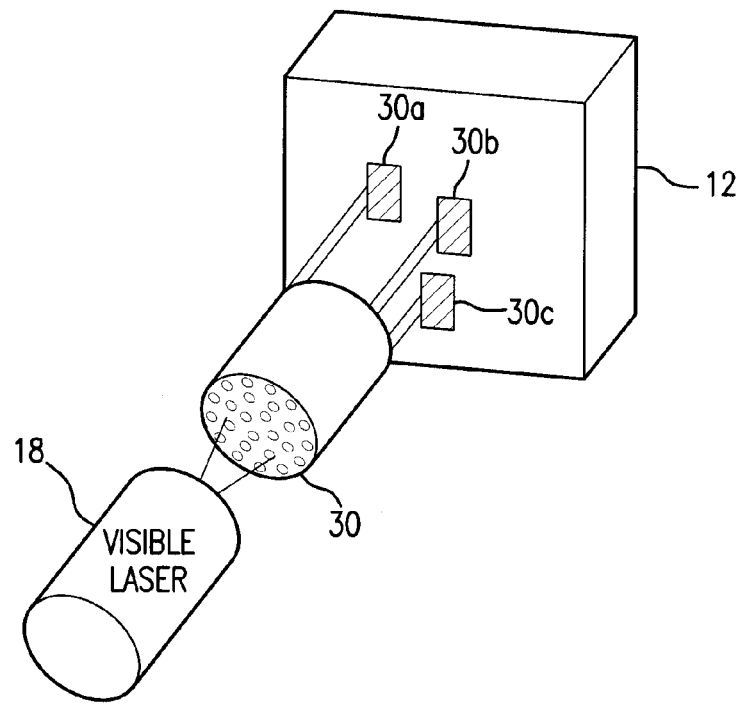
FIG. 6 is a schematic diagram of an embodiment of the present invention in which light pipes are arranged for irradiating a plurality of regions of the substrate.

Referring now to FIG. 6 there is shown a plurality of predetermined areas of the substrate irradiated by a plurality of beams or "beamlets", wherein the plurality of beams is provided by a predetermined array of light pipes. As the name indicates, light pipes comprise any number of "pipe-like" delivery mechanisms for the laser light. In this particular embodiment a fiber bundle is chosen. The bundle functions as a 1×N delivery system: there is one input and N outputs, each containing a "beamlet" of laser energy. The incident laser beam 36 illuminates an input face of a fiber bundle 30. The bundle consists of multiple fiber optic paths through which the incident beam(s) travels. In this fashion, multiple beams or "beamlets" 30a, 30b, and 30c are produced and utilized for simultaneously irradiating a plurality of dopant regions 10a, 10b, or 10c of the substrate surface 34. These dopant regions correspond in number and position to each of the individual fiber bundles. The fiber bundles help to further homogenize the incident beam. In this fashion, the entire plurality of predetermined dopant regions is simultaneously and rapidly irradiated. Focusing optics 24 may be disposed after the "beamlets" exit the bundles.

Figure 7:
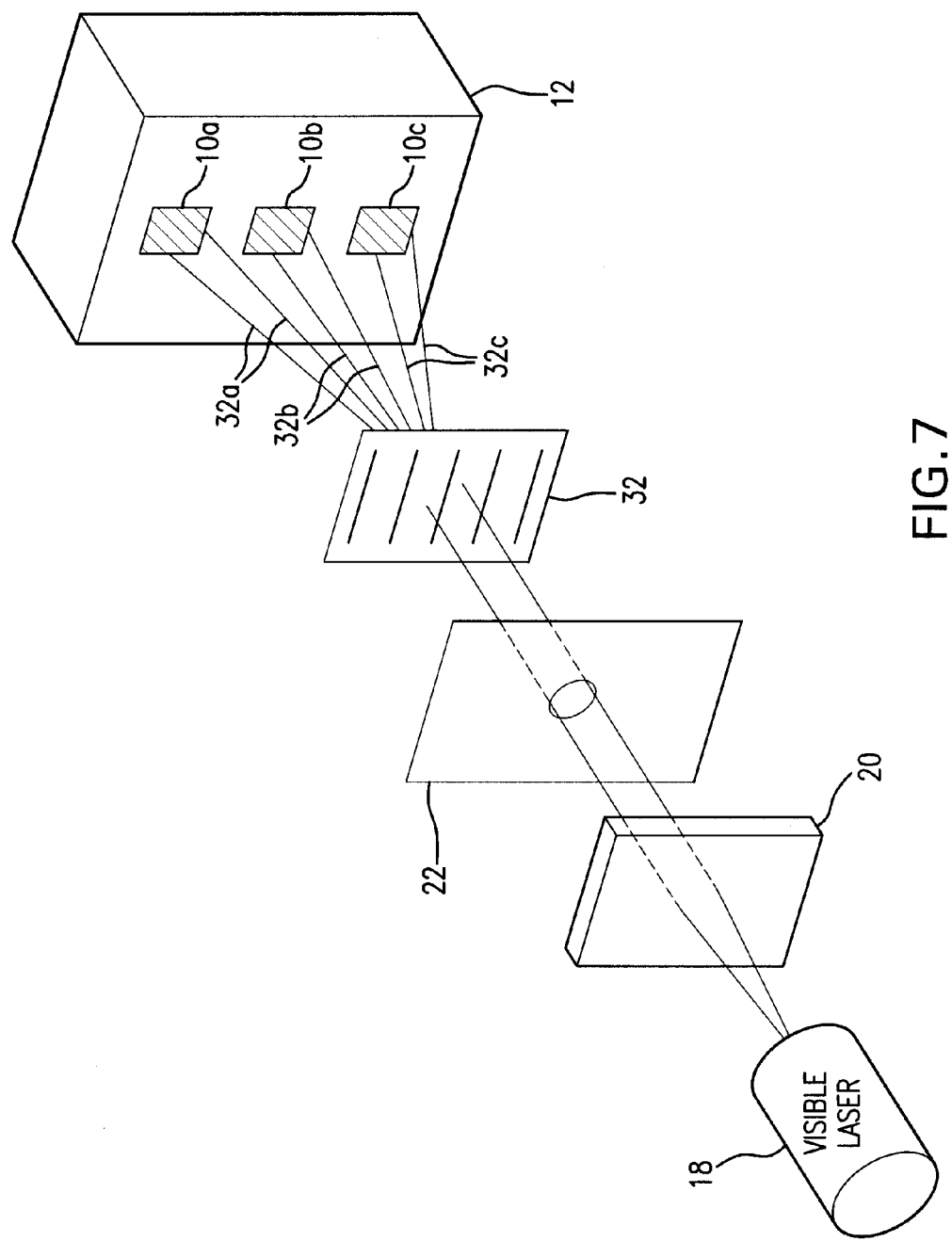
FIG. 7 is a schematic diagram of another embodiment of the present invention in which the plurality of beams are provided by a holographic optical element.

Depicted in FIG. 7 is another embodiment of the subject method, in which the laser beam 36 is directed through a holographic optical element 32 in order to produce the plurality of "beamlets" 32a, 32b, or 32c (other optical elements not shown). Holographic optical elements (HOE) are a class of diffractive devices. They can be used as lenses, mirrors, gratings, etc. Among their advantages are ease of manufacture, low weight, and they can be formed in very thin films. They are wavelength dependent and their small size complements existing methods and systems where space is a critical factor. In the subject method, the HOE breaks up the homogenized laser beam 38 into the multiple "beamlets" 32a, 32b, or 32c and also focuses these "beamlets" to the predetermined dopant regions 10a, 10b, or 10c.

It will be apparent to those skilled in the art that further combinations for providing a plurality of beams, and as well as homogenizing and focusing optics can be utilized while remaining within the scope of the method of the present invention The disclosed method provides a unique and novel way of introducing dopants into a substrate for fabricating a semiconductor material. The problems of excess surface heat build-up and excess laser energy attributable to conventional UV lasers are solved by using spatially selective doping by pulsed, visible lasers. Only predetermined areas of the semiconductor substrate that are required to contain desired elements need to be irradiated. Hence, the laser irradiates only those areas, thus reducing overall exposure time as well as reducing the amount of unnecessarily deposited laser energy. Overlapping and averaging the spatial modes of the incoherent beam provides a more energy-stable, uniform beam with superior energy deposition characteristics. This reduces the number of laser shots required in conventional doping methods, further saving time and energy costs.

The described embodiments are presented for clarity and are exemplary; they are not limited to such. Further enhancements and modifications of the subject method can be achieved without departing from the spirit and scope of the invention.

What is claimed is:

1. A method of doping a semiconductor substrate comprising the steps of:
   depositing a source of dopants onto a surface of a substrate and defining a plurality of doping regions;
   establishing a laser source emitting a pulsed visible laser beam;
   controlling said laser beam for focusing said laser beam on at least one selectively predetermined doping region of said plurality of doping regions on said surface of said substrate;
   homogenizing a plurality of spatial modes of the laser beam, producing a substantially spatially uniform laser beam;
   focusing the substantially spatially uniform beam onto the at least one selectively predetermined doping region for implanting the dopants into the substrate; and
   moving a location of the focus of the beam in three dimensions including (1) displacement substantially in the plane of the substrate surface, and (2) substantially in a plane perpendicular to the substrate surface.

2. The method as recited in claim 1, wherein the source is deposited by a method selected from the group consisting of Plasma Enhanced Chemical Vapor Deposition (PECVD), spinning onto the material to form a liquid organic matrix, and spinning onto the material to form a spin-on glass.

3. The method as recited in claim 1, wherein the laser beam has a wavelength substantially within the range of 500-600 nm.

4. The method as recited in claim 1, wherein a pulse width of the laser beam is less than or equal to 200 ns.

5. The method as recited in claim 1, wherein the emitted laser beam has a beam quality factor $M^2>15$, prior to the step of overlapping.

6. The method as recited in claim 1, wherein the substrate comprises at least one planar surface, said planar surface controlled to a flatness within substantially +/−30% of the Raleigh range of the focused beam.

7. The method as recited in claim 1, wherein a repetition rate of the pulsed laser beam is <50 Khz.

8. The method as recited in claim 1, where the step of controlling said laser beam includes the step of:
   moving a location of the focus of the beam in two dimensions substantially in the plane of the substrate surface, for focusing said beam onto another region.

9. The method as recited in claim 8, wherein the step of moving is performed by a 2-axis galvanometer.

10. The method as recited in claim 1, wherein the step of homogenizing further comprises the steps of:
    establishing at least one optical component for directing said laser beam in a predetermined direction; and
    overlapping and averaging said plurality of spatial modes of the laser beam.

11. The method as recited in claim 10, wherein the at least one optical component comprises a glass rod.

12. The method as recited in claim 10, wherein a shape of the beam is rectilinear, said shape produced by an aperture disposed adjacent to and after the at least one optical component, wherein the beam passes through the aperture after being homogenized by the at least one optical component.

13. The method as recited in claim 1, wherein the step of moving is performed with a 3-axis stage.

14. The method as recited in claim 1, further comprising the step of
    establishing a plurality of pulsed visible laser beams.

15. The method as recited in claim 14, wherein the step of establishing a plurality of pulsed visible laser beams includes the step of
    establishing a plurality of light pipes for directing said plurality of laser beams to a plurality of predetermined regions patterned on said substrate surface.

16. The method as recited in claim 15, wherein the plurality of light pipes is disposed in a predetermined two-dimensional array, corresponding to the plurality of predetermined regions patterned on said substrate surface.

17. The method as recited in claim 16, wherein the plurality of light pipes comprises a 1×N fiber bundle, where N is at least two.

18. The method as recited in claim 14, wherein the plurality of pulsed, visible laser beams is provided by at least one holographic optical element; wherein said pulsed visible beam emitted by the laser source passes through the at least one holographic optical element, for creating the plurality of visible laser beams.

19. The method as recited in claim 1, wherein the semiconductor substrate comprises poly-crystalline silicon.

20. A method of doping a semiconductor substrate comprising the steps of:
    depositing a source of dopants onto a surface of a substrate and defining a plurality of doping regions;
    establishing a laser source emitting a pulsed visible laser beam;
    controlling said laser beam for focusing said laser beam on at least two doping regions of said plurality of doping regions on said surface of said substrate;
    homogenizing a plurality of spatial nodes of the laser beam, producing a substantially spatially uniform laser beam; and
    focusing the beam in an overlapping relation onto at least two adjacent predetermined doping regions for implanting the dopant into said substrate surface; said beam having a spatial area larger than the area of each of said predetermined regions.

* * * * *